(12) United States Patent
Gollier et al.

(10) Patent No.: US 7,769,063 B2
(45) Date of Patent: Aug. 3, 2010

(54) CORRECTION OF POWER VARIATIONS IN LASER SOURCES

(75) Inventors: Jacques Gollier, Painted Post, NY (US); Martin Hai Hu, Painted Post, NY (US); David August Sniezek Loeber, Horseheads, NY (US); Dragan Pikula, Horseheads, NY (US); Daniel Ohen Ricketts, Corning, NY (US)

(73) Assignee: Corning Incorporated, Corning, NY (US)

( * ) Notice: Subject to any disclaimer, the term of this patent is extended or adjusted under 35 U.S.C. 154(b) by 117 days.

(21) Appl. No.: 12/257,043

(22) Filed: Oct. 23, 2008

(65) Prior Publication Data

US 2010/0103967 A1    Apr. 29, 2010

(51) Int. Cl.
*H01S 3/13* (2006.01)
(52) U.S. Cl. .............................. 372/29.021; 372/29.014
(58) Field of Classification Search ............ 372/29.014, 372/29.021
See application file for complete search history.

(56) References Cited

U.S. PATENT DOCUMENTS

| | | | |
|---|---|---|---|
| 5,867,152 A | 2/1999 | Sextro | 345/207 |
| 5,889,801 A | 3/1999 | Kato et al. | 372/20 |
| 7,233,609 B2 | 6/2007 | Lai et al. | 372/38.07 |
| 2005/0117132 A1 | 6/2005 | Agostinelli | 353/122 |
| 2005/0254531 A1 | 11/2005 | Furukawa et al. | 372/22 |

FOREIGN PATENT DOCUMENTS

JP    2007-043068    2/2007

*Primary Examiner*—Armando Rodriguez
(74) *Attorney, Agent, or Firm*—Gregory V. Bean

(57) ABSTRACT

The present invention relates generally to semiconductor lasers and laser projection systems. According to one embodiment of the present invention, a method of correcting output power variations in a semiconductor laser is provided. According to the method, an output power feedback loop is utilized to generate optical intensity feedback signals representing actual output power of the laser source for discrete portions $V_1$, $V_i$, ... $V_j$ of the image signal. Error signals $E_1$, $E_i$, ... $E_j$ are generated representing the degree to which actual projected output power varies from a target projected output power for the discrete portions $V_1$, $V_i$, ... $V_j$ of the image signal. These error signals $E_1$, $E_i$, ... $E_j$ are utilized to apply corrected control signals $G_1'$, $G_i'$, ... $G_j'$ to the gain section of the semiconductor laser for projection of compatible discrete portions $V_1'$, $V_i'$, ... $V_j'$ of the image signal. According to another embodiment of the present invention, a system is provided for generating a projected laser image.

16 Claims, 2 Drawing Sheets

CORRECTION OF POWER VARIATIONS IN LASER SOURCES

CROSS REFERENCE TO RELATED APPLICATIONS

The present application is related to and commonly assigned U.S. patent application Ser. No. 12/080,852, filed Apr. 7, 2008 but does not claim priority thereto.

BACKGROUND OF THE INVENTION

The present invention relates generally to semiconductor lasers and, more particularly, to schemes for correcting laser power variations by applying corrected control signals to the gain section of a semiconductor laser. The correction schemes of the present invention may be combined with other schemes for correcting or minimizing laser power variations or for optimizing lasing wavelength including, for example, DBR and gain control schemes, where the wavelength selective section and/or the gain section of a DBR laser is controlled for optimal IR to green conversion in a frequency doubled laser source. By way of illustration, not limitation, examples of such schemes are disclosed in commonly owned pending U.S. patent application Ser. Nos. 11/549,856, 11/900,761, 11/894,846, and 12/080,852, the disclosures of which are incorporated herein by reference. The present invention also relates to laser controllers and laser projection systems programmed according to the present invention.

SUMMARY OF THE INVENTION

The present invention relates generally to semiconductor lasers, which may be configured in a variety of ways. For example and by way of illustration, not limitation, short wavelength sources can be configured for high-speed modulation by combining a single-wavelength semiconductor laser, such as a distributed feedback (DFB) laser, a distributed Bragg reflector (DBR) laser, or a Fabry-Perot laser with a light wavelength conversion device, such as a second harmonic generation (SHG) crystal, e.g., MgO-doped periodically poled lithium niobate (PPLN). The SHG crystal can be configured to generate higher harmonic waves of the fundamental laser signal by tuning, for example, a 1060 nm DBR or DFB laser to the spectral center of a SHG crystal, which converts the wavelength to 530 nm.

A number of factors can affect the wavelength-convened output power of the aforementioned types of laser sources. For example, and not by way of limitation, in the context of a laser source comprising an IR semiconductor laser and a PPLN SHG crystal, temperature and time-dependent variations in IR power over the life of the laser can cause variations in the green output power. Temperature and time-dependent variations in IR beam alignment relative to the SHG waveguide on the input face of the crystal can also lead to variations in the output power of the laser source. Further, over the life of the IR laser and as the operating temperature of the laser varies, the higher order spatial mode content of the IR laser can vary and, since higher order modes typically do not convert to green as efficiently, green output power can also vary.

Mode hopping and uncontrolled large wavelength variations within the laser cavity can also lead to output power variations because the bandwidth of a PPLN SHG device is often very small. For example, a typical PPLN SHG wavelength conversion device, the full width half maximum (FWHM) wavelength conversion bandwidth is only in the 0.16 to 0.2 nm range and mostly depends on the length of the crystal. If the output wavelength of a semiconductor laser moves outside of this allowable bandwidth during operation, the output power of the conversion device at the target wavelength can drop drastically. In laser projection systems, in particular, mode hops are particularly problematic because they can generate instantaneous changes in power that will be readily visible as defects in specific locations in the image.

In typical RGB projection systems that utilize wavelength conversion devices, variations in IR power from any of the aforementioned sources can cause green power to change and create errors in the color balance of the projected laser image. The present inventors have recognized potentially beneficial schemes for correcting these power variations by applying corrected control signals to the gain section of the semiconductor laser.

For example, according to one embodiment of the present invention, a method of correcting output power variations in a semiconductor laser is provided. According to the method, an output power feedback loop is utilized to generate optical intensity feedback signals representing actual output power of the laser source for discrete portions $V_1, V_i, \ldots V_j$ of the image signal. Error signals $E_1, E_i, \ldots E_j$ are generated representing the degree to which actual projected output power varies from a target projected output power for the discrete portions $V_1, V_i, \ldots V_j$ of the image signal. These error signals $E_1, E_i, \ldots E_j$ are utilized to apply corrected control signals $G_1', G_i', \ldots G_j'$ to the gain section of the semiconductor laser for projection of compatible discrete portions $V_1', V_i', \ldots V_j'$ of the image signal.

According to another embodiment of the present invention, a system is provided for generating a projected laser image. The system comprises at least one laser source, an optical intensity monitor, and projection optics. The optical intensity monitor forms at least a portion of an output power feedback loop configured to control a gain section of the semiconductor laser as a function of optical intensity.

The present inventors have recognized that although the concepts of the present invention are described primarily in the context of DBR lasers, with or without phase matching sections, it is contemplated that the control schemes discussed herein will also have utility in a variety of types of semiconductor lasers, including but not limited to DFB lasers, Fabry-Perot lasers, and many types of external cavity lasers.

BRIEF DESCRIPTION OF THE DRAWINGS

The following detailed description of specific embodiments of the present invention can be best understood when read in conjunction with the following drawings, where like structure is indicated with like reference numerals and in which.

DETAILED DESCRIPTION

Figure 1:
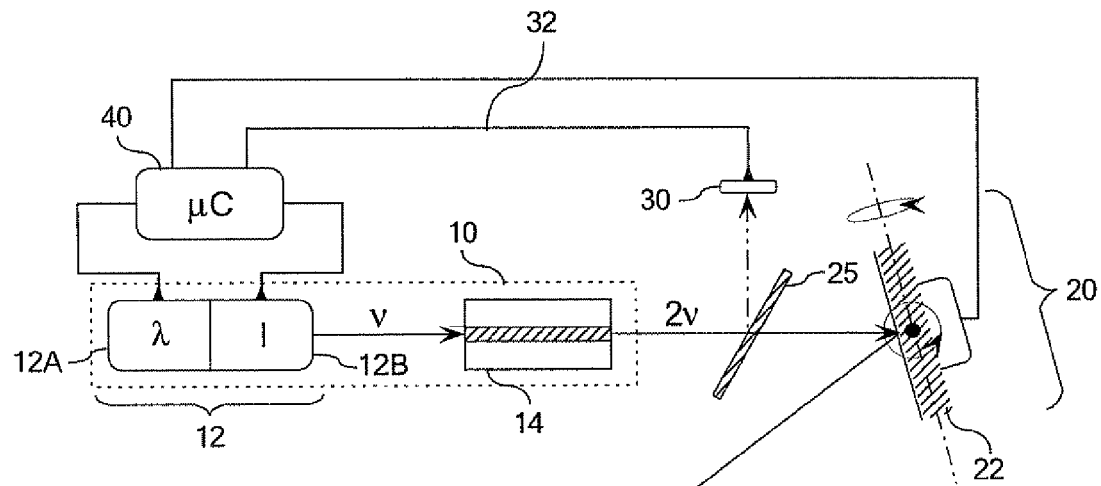
FIG. 1 is a schematic illustration of a laser projection system suitable for executing various laser control schemes according to particular embodiments of the present invention.

Referring initially to FIG. 1, the concepts of the present invention may be conveniently illustrated with general reference to a laser source 10 comprising a two-section DBR-type semiconductor laser 12, although the concepts of the present invention can be executed in the context of various types of semiconductor lasers, the design and operation of which is described generally above and is taught in readily available technical literature relating to the design and fabrication of semiconductor lasers. In the context of a frequency-doubled light source of the type illustrated in FIG. 1, the DBR laser 12 is optically coupled to a light wavelength conversion device 14. The light beam emitted by the semiconductor laser 12 can be either directly coupled into the waveguide of the wavelength conversion device 14 or can be coupled through collimating and focusing optics or some other type of suitable optical element or optical system. The wavelength conversion device 14 converts the incident light v into higher harmonic waves 2v and outputs the converted signal.

This type of configuration is particularly useful in generating shorter wavelength laser beams from longer wavelength semiconductor lasers and can be used, for example, as a visible laser source 10 for a single-color laser projection system 100 or a multi-color RGB laser projection system comprising, for example, the laser source 10, laser projection optics 20, a partially reflective beam splitter 25, an optical intensity monitor 30, and a controller 40, which may be stand-alone laser controller or a programmable projection controller incorporating a laser controller. The laser projection optics 20 may comprise a variety of optical elements including, but not limited to, a two-axis, gimbal mounted, MEMS scanning mirror 22. These optical elements cooperate to generate a two-dimensional scanned laser image on a projection screen 50 or in an image field.

The partially reflective beam splitter 25 directs a portion of the light generated by the laser source 10 to the optical intensity monitor 30. The optical intensity monitor 30 is configured to generate an electrical or optical signal representing variations in the intensity of the light generated by the laser source. The controller 40, which is in communication with the optical intensity monitor 30, receives or samples the signal from the optical intensity monitor 30 and can be programmed to control the laser source as a function of the sampled intensity, as is explained in further detail below. It is contemplated that a variety of alternative configurations may be utilized to monitor the intensity of the output beam without departing from the scope of the present invention. It is noted that the beam splitter 25, the laser source 10, the optical intensity monitor 30, and the controller 40 are merely illustrated schematically in FIG. 1, and that their respective positions and orientations relative to each other and any system housing may vary widely according to the specific needs of the particular field in which the system is utilized. For example, and not by way of limitation, it is noted that the beam splitter 25 and optical intensity monitor 30 may be positioned within, or external to, a housing for the laser source 10.

The DBR laser 12 illustrated schematically in FIG. 1 comprises a wavelength selective section 12A and a gain section 12B. The wavelength selective section 12A, which can also be referred to as the DBR section of the laser 12, typically comprises a first order or second order Bragg grating positioned outside the active region of the laser cavity. This section provides wavelength selection, as the grating acts as a mirror whose reflection coefficient depends on the wavelength. The gain section 12B of the DBR laser 12 provides the major optical gain of the laser. A phase matching section may also be employed to create an adjustable phase shift between the gain material of the gain section 12B and the reflective material of the wavelength selective section 12A. The wavelength selective section 12A may be provided in a number of suitable alternative configurations that may or may not employ a Bragg grating.

The wavelength conversion efficiency of the wavelength conversion device 14 illustrated in FIG. 1 is dependent on the wavelength matching between the DBR laser 12 and the wavelength conversion device 14. The output power of the higher harmonic light wave generated in the wavelength conversion device 14 can change drastically as the alignment of the output wavelength of the DBR laser 12 relative to the wavelength conversion bandwidth of the wavelength conversion device 14 changes. For example, when a semiconductor laser is modulated to produce data, the thermal load on the laser varies constantly. The resulting change in laser temperature and lasing wavelength generates a variation of the conversion efficiency of the associated wavelength conversion device. As a result, the output power of the higher harmonic light will vary from its target value.

A number of additional factors can affect the wavelength-converted output power of wavelength-converted laser sources. For example, mode hopping and uncontrolled large wavelength variations within the laser cavity are a commonly suspected source of output power errors. Although the aforementioned commonly owned pending U.S. patent application Ser. No. 11/549,856 (D 20106) is directed to minimizing the adverse effects of mode hopping and uncontrolled large wavelength variations within the laser cavity, the present invention is introduced as an alternative or complementary means for addressing output power error in wavelength converted laser sources.

As is noted above, the present invention generally relates to control schemes where output power variations are minimized by applying corrected control signals to the gain section of a semiconductor laser. More specifically, referring collectively to FIGS. 1 and 2, the illustrated laser projection system 100 comprises the laser source 10, the optical intensity monitor 30, and the projection optics 20. The optical intensity monitor 30 forms at least a portion of an output power feedback loop 32 configured to control the gain section 12B of the semiconductor laser 12 as a function of optical intensity. According to the control scheme, a laser image is initially projected by utilizing an image signal to drive the laser source 10 and the projection optics 20. A series of control signals $G_1, G_i, \ldots G_j$, which may or may not include initial calibration or correction components, are applied to the gain section 12B of the semiconductor laser 12 for projection of a series of discrete portions $V_1, V_i, \ldots V_j$ of the image signal. Individually, the discrete portions $V_1, V_i, \ldots V_j$ of the image signal may correspond to a single image pixel, a plurality of image pixels within a single image line, or a plurality of image pixels across a plurality of image lines.

Upon projection, the aforementioned output power feedback loop 32 is utilized to generate optical intensity feedback signals representing actual output power of the laser source 10 for the discrete portions $V_1, V_i, \ldots V_j$ of the image signal. Next, error signals $E_1, E_i, \ldots E_j$ representing the degree to which actual projected output power varies from a target projected output power for the discrete portions $V_1, V_i, \ldots V_j$ of the image signal are generated. These error signals $E_1, E_i, \ldots E_j$ are utilized to apply corrected control signals $G_1', G_i', \ldots G_j'$ to the gain section 12B of the semiconductor laser 12 for projection of compatible discrete portions $V_1', V_i', \ldots V_j'$ of the image signal. As is explained in detail herein with reference to FIGS. 2 and 3, the temporal or physical placement of the compatible discrete portions $V_1', V_i', \ldots V_j'$ of the image signal in the projected laser image is such that the image content of the compatible discrete portions $V_1'$, $V_i'$, ... $V_j'$ of the image signal is likely to mimic the image content of the discrete portions $V_1$, $V_i$, ... $V_j$ of the image signal.

Figure 2:
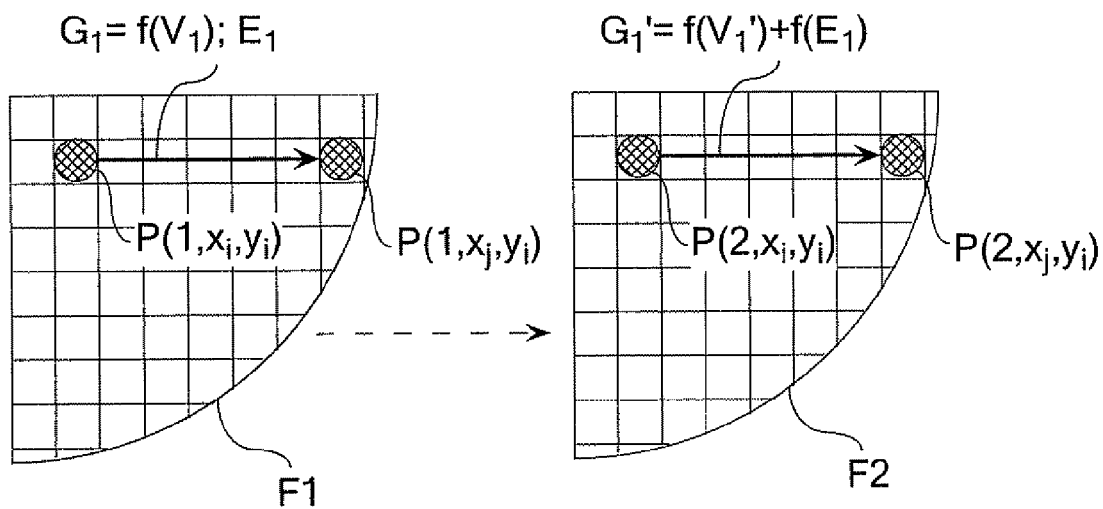
FIG. 2 is a schematic illustration of particular aspects of the present invention in the context of a series of frames of a projected image.

For example, referring to FIG. 2, the image signal comprises a series of pixel frames F1, F2, etc. The discrete portion $V_1$ of the image signal appears in the first projected pixel frame F1 and the compatible discrete portion $V_1'$ of the image signal appears in the subsequent projected pixel frame F2. Each pixel frame comprises a plurality of these discrete portions. The discrete portions $V_1$, $V_i$, ... $V_j$ and the compatible discrete portions $V_1'$, $V_i'$, ... $V_j'$ of the image signal occupy approximately equivalent pixels in the two different pixel frames F1, F2 of the projected laser image. In this manner, because video content varies slowly from frame to frame, an error signal $E_1$, $E_i$, ... $E_j$ generated in the projection of the first pixel frame F1 can be utilized to apply the corrected control signals $G_1'$, $G_i'$, ... $G_j'$ for projection of the compatible discrete portions $V_1'$, $V_i'$, ... $V_j'$ of the image signal in next pixel frame F2 in approximately the same area of the projection frame. In other words, as the content of successive frames is very similar, we can expect the error signal of frame i+1 to be similar to the error signal of frame i. So, by monitoring the error signal when frame i is being displayed, we can predict the error signal that we may expect for frame i+1 and, therefore determine a correction signal applied to the gain section of the laser that will compensate for it.

Figure 3:
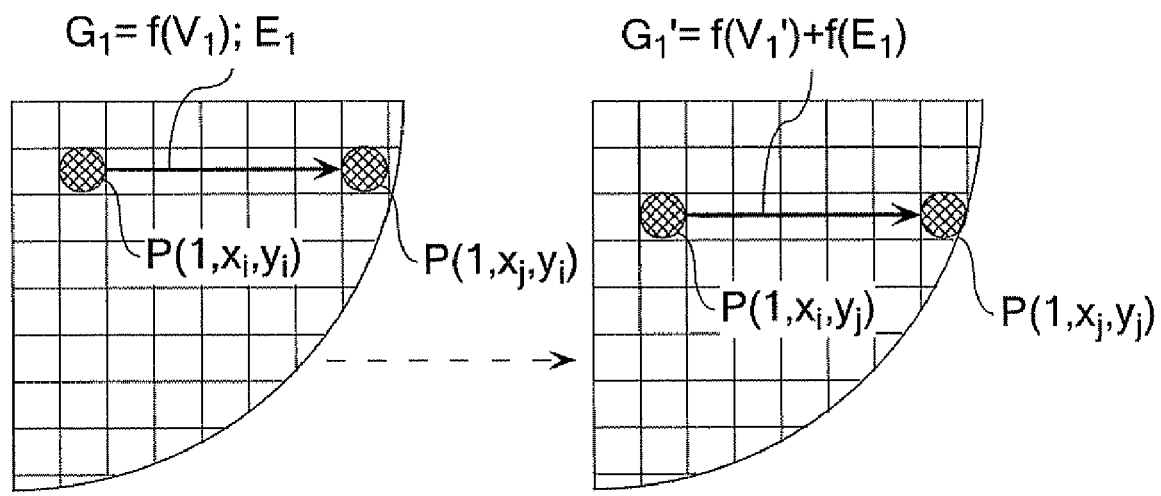
FIG. 3 is a schematic illustration of particular aspects of the present invention in the context of a series of frame lines within a common frame of a projected image.

FIG. 3 illustrates a similar scheme, with the exception that the compatible discrete portions $V_1'$, $V_i'$, ... $V_j'$ and the discrete portions $V_1$, $V_i$, ... $V_j$ of the image signal appear in adjacent frame lines of a common pixel frame. Here again, because video content varies slowly from line to line, an error signal $E_1$, $E_i$, ... $E_j$ generated in the projection of one line of a given pixel frame F1 can be utilized to apply the corrected control signals $G_1'$, $G_i'$, ... $G_j'$ for projection of the compatible discrete portions $V_1'$, $V_i'$, ... $V_j'$ of the image signal in approximately equivalent pixels of the next line of the common pixel frame F1. This approach is similar to the previous one except that correction is applied on a line per line basis instead of a frame per frame basis. It is also contemplated that an additional approach may affect correction on a pixel-by-pixel basis through application of the correction in approximately equivalent pixels of a common pixel frame.

In each of the aforementioned embodiments, the image signal comprises a series of pixel frames and the method may further comprise the steps of storing corrected control signals $G_1'$, $G_i'$, ... $G_j'$ for pixels within the series of pixel frames and utilizing subsequently generated error signals $E_1$, $E_i$, ... $E_j$ to update the corrected control signals $G_1'$, $G_i'$, ... $G_j'$. More specifically, the controller 40 may implemented as a digital signal processor with two inputs and one output. Inputs to the controller 40 could be target projected output power and measured output power. The controller 40 could be programmed to allocate a buffer containing corrections for each pixel. As time passes, the target output power and the measured output power can be sampled for given time slots and compared. Depending on the error generated from the comparison, the correction for the sampled time slots can be updated and the new correction for the time slot is applied during next video frame or the next video line.

Although the control signals $G_1$, $G_i$, ... $G_j$ and the corrected control signals $G_1'$, $G_i'$, ... $G_j'$ may take a variety of forms in accordance with the present invention, in one embodiment, the control signals can be applied to the gain section 12B of the semiconductor laser 12 as follows:

$$G_{1, i, \ldots j} = f(V_{1, i, \ldots j}) \text{ and}$$

$$G_{1, i, \ldots j}' = f(V_{1, i, \ldots j}') + g(E_1, E_i, \ldots E_j)$$

where $f(V_{1, i, \ldots j})$ and $f(V_{1, i, \ldots j}')$ represent calibrated projector functions corresponding to the discrete portions $V_1$, $V_i$, ... $V_j$ and the compatible discrete portions $V_1'$, $V_i'$, ... $V_j'$ of the image signal and $g(E_1, E_i, \ldots E_j)$ represents a correction factor function corresponding to the generated error signals $E_1$, $E_i$, ... $E_j$.

The correction factor function $g(E_1, E_i, \ldots E_j)$ may merely represent a series of correction currents $C_1$, $C_i$, ... $C_j$ for each compatible discrete portion $V_1'$, $V_i'$, ... $V_j'$ of the image signal. The correction factor function $g(E_1, E_i, \ldots E_j)$ for the series of correction currents $C_1$, $C_i$, ... $C_j$ may comprise an additive or multiplicative function. For example, although a particular correction current C may be created by merely adding a correction value B to the gain control signal G of the laser G'=G+B, in cases where the output power is sampled at a rate that is slower than the actual pixel rate, error will be judged on an average of several pixels. Since individual pixels may have different intensity values, merely adding the same correction value to all of the pixels may cause errors In multiplicative form, where G'=G×(1+B), the correction is carried out on a percentage-of-intensity basis.

It is to be understood that the preceding detailed description of the invention is intended to provide an overview or framework for understanding the nature and character of the invention as it is claimed. It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

For example, although the control schemes described herein relate to correcting output power variations in a semiconductor laser by controlling a drive current applied to a gain section or wavelength selective DBR section of a semiconductor laser, it is contemplated that methods of incorporating the wavelength recovery operation of the present invention in a laser operating scheme are not limited to drive currents applied to only these portions of a laser.

In addition, it is contemplated that wavelength conversion devices for use in the context of the present invention may comprise PPLN SHG crystals, other types of conventional or yet to be developed SHG crystals, or any other type of conventional or yet to be developed wavelength conversion device.

It should be further understood that references herein to particular steps or operations that are described or claimed herein as being performed "as a function" of a particular state, condition, value, or other type of variable or parameter should not be read to limit execution of the step or operation solely as a function of the named variable or parameter. Rather, it should be understood that additional factors may play a role in the performance of the step or operation. For example, particular embodiments of the present invention recite initiation of a wavelength recovery operation as a function of a gain current control signal but this recitation should not be read to limit execution of the operation solely as a function of the gain current control signal.

It is noted that terms like "preferably," "commonly," and "typically," when utilized herein, are not intended to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention. Further, it is noted that reference to a value, parameter, or variable being a "function of" another value, parameter, or variable should not be taken to mean that the value, parameter, or variable is a function of one and only one value, parameter, or variable.

For the purposes of describing and defining the present invention it is noted that the terms "substantially" or "approximately" are utilized herein to represent the inherent degree of uncertainty that may be attributed to any quantitative comparison, value, measurement, or other representation. The terms "substantially" and "approximately" are also utilized herein to represent the degree by which a quantitative representation. e.g., "substantially above zero," varies from a stated reference, e.g., "zero," and should be interpreted to require that the quantitative representation varies from the stated reference by a readily discernable amount.

It is also noted that recitations herein of a component of the present invention being "configured" or "programmed" in a particular way, to embody a particular property, or function in a particular manner, are structural recitations as opposed to recitations of intended use. More specifically, the references herein to the manner in which a component is "configured" or "programmed" denote an existing physical condition of the component and, as such, are to be taken as a definite recitation of the structural characteristics of the component.

What is claimed is:

1. A method of operating a system for generating a projected laser image, the system comprising at least one laser source, an optical intensity monitor, and laser scanning projection optics, wherein the optical intensity monitor forms at least a portion of an output power feedback loop configured to control a gain section of the semiconductor laser as a function of optical intensity and the method comprises:

projecting a laser image by utilizing an image signal to drive the laser source and the projection optics, wherein a series of control signals $G_1, G_i, \ldots G_j$ are applied to the gain section of the semiconductor laser for projection of a series of discrete portions $V_1, V_i, \ldots V_j$ of the image signal;

utilizing the output power feedback loop to generate optical intensity feedback signals representing actual output power of the laser source for the discrete portions $V_1, V_i, \ldots V_j$ of the image signal;

generating error signals $E_1, E_i, \ldots E_j$ representing the degree to which actual projected output power varies from a target projected output power for the discrete portions $V_1, V_i, \ldots V_j$ of the image signal; and utilizing the error signals $E_1, E_i, \ldots E_j$ to apply corrected control signals $G_1', G_i', \ldots G_j'$ to the gain section of the semiconductor laser for projection of compatible discrete portions $V_1', V_i', \ldots V_j'$ of the image signal, wherein the temporal or physical placement of the compatible discrete portions $V_1', V_i', \ldots V_j'$ of the image signal in the projected laser image is such that the image content of the compatible discrete portions $V_1', V_i', \ldots V_j'$ of the image signal is likely to mimic the image content of the discrete portions $V_1, V_i, \ldots V_j$ of the image signal.

2. A method as claimed in claim 1 wherein:
    the image signal comprises a series of pixel frames; and
    the compatible discrete portions $V_1', V_i', \ldots V_j'$ of the image signal appear in a pixel frame that is projected subsequent to a pixel frame in which the discrete portions $V_1, V_i, \ldots V_j$ of the image signal are projected.

3. A method as claimed in claim 2 wherein the discrete portions $V_1, V_i, \ldots V_j$ and the compatible discrete portions $V_1', V_i', \ldots V_j'$ of the image signal occupy approximately equivalent pixels in different pixel frames of the projected laser image.

4. A method as claimed in claim 2 the discrete portions $V_1, V_i, \ldots V_j$ and the compatible discrete portions $V_1', V_i', \ldots V_j'$ of the image signal correspond to a single image pixel, a plurality of image pixels within a single image line, or a plurality of image pixels across a plurality of image lines.

5. A method as claimed in claim 1 wherein:
    the image signal comprises a series of pixel frames, each comprising a series of frame lines;
    the compatible discrete portions $V_1', V_i', \ldots V_j'$ and the discrete portions $V_1, V_i, \ldots V_j$ of the image signal appear in a common pixel frame; and
    the compatible discrete portions $V_1', V_i', \ldots V_j'$ of the image signal appear in a frame line that is projected subsequent to a frame line in which the discrete portions $V_1, V_i, \ldots V_j$ of the image signal are projected.

6. A method as claimed in claim 5 wherein the discrete portions $V_1, V_i, \ldots V_j$ and the compatible discrete portions $V_1', V_i', \ldots V_j'$ of the image signal occupy approximately equivalent pixels of adjacent frame lines.

7. A method as claimed in claim 5 wherein the discrete portions $V_1, V_i, \ldots V_j$ and the compatible discrete portions $V_1', V_i', \ldots V_j'$ of the image signal correspond to a single image pixel, a plurality of image pixels within a single image line, or a plurality of image pixels across a plurality of image lines.

8. A method as claimed in claim 1 wherein:
    the image signal comprises a series of pixel frames, each comprising a two-dimensional array of pixels;
    the compatible discrete portions $V_1', V_i', \ldots V_j'$ and the discrete portions $V_1, V_i, \ldots V_j$ of the image signal appear in a common pixel frame; and
    the compatible discrete portions $V_1', V_i', \ldots V_j'$ of the image signal appear in a pixel that is projected subsequent to a pixel in which the discrete portions $V_1, V_i, \ldots V_j$ of the image signal are projected.

9. A method as claimed in claim 8 wherein the discrete portions $V_1, V_i, \ldots V_j$ and the compatible discrete portions $V_1', V_i', \ldots V_j'$ of the image signal occupy approximately equivalent pixels of the same frame.

10. A method as claimed in claim 1 wherein the image signal comprises a series of pixel frames and the method further comprises storing corrected control signals $G_1', G_i', \ldots G_j'$ for pixels within the series of pixel frames and utilizing subsequently generated error signals $E_1, E_i, \ldots E_j$ to update the corrected control signals $G_1', G_i', \ldots G_j'$.

11. A method as claimed in claim 1 wherein the control signals $G_1, G_i, \ldots G_j$ and the corrected control signals $G_1', G_i', \ldots G_j'$ are applied to the gain section as follows:

$$G_{1, i, \ldots j} = f(V_{1, i, \ldots j}) \text{ and}$$

$$G_{1, i, \ldots j}' = f(V_{1, i, \ldots j}) + g(E_1, E_i, \ldots E_j)$$

where $f(V_{1, i, \ldots j})$ and $f(V_{1, i, \ldots j}')$ represent calibrated projector functions corresponding to the discrete portions $V_1, V_i, \ldots V_j$ and the compatible discrete portions $V_1', V_i', \ldots V_j'$ of the image signal and $g(E_1, E_i, \ldots E_j)$ represents a correction factor function corresponding to the generated error signals $E_1, E_i, \ldots E_j$.

12. A method as claimed in claim 11 wherein the correction factor function $g(E_1, E_i, \ldots E_j)$ represents a series of correction currents $C_1, C_i, \ldots C_j$ for each compatible discrete portion $V_1', V_i', \ldots V_j'$ of the image signal.

13. A method as claimed in claim 12 wherein the correction factor function $g(E_1, E_i, \ldots E_j)$ for tie series of correction currents $C_1, C_i, \ldots C_j$ comprises an additive or multiplicative function.

14. A method as claimed in claim 1 wherein:
the laser source comprises a semiconductor laser optically coupled to a wavelength conversion device; and
the variations in the actual projected output power are at least partially attributable to wavelength mismatch between the semiconductor laser and the wavelength conversion device.

15. A method as claimed in claim 1 wherein the semiconductor laser is comprised within a multi-color laser projection system.

16. A system for generating a projected laser image, the system comprising at least one laser source, an optical intensity monitor, and projection optics, wherein the optical intensity monitor forms at least a portion of an output power feedback loop configured to control a gain section of the semiconductor laser as a function of optical intensity and the system is programmed to:

project a laser image by utilizing an image signal to drive the laser source and the projection optics, wherein a series of control signals $G_1, G_i, \ldots G_j$ are applied to the gain section of the semiconductor laser for projection of a series of discrete portions $V_1, V_i, \ldots V_j$ of the image signal;

utilize the output power feedback loop to generate optical intensity feedback signals representing actual output power of the laser source for the discrete portions $V_1, V_i, \ldots V_j$ of the image signal;

generate error signals $E_1, E_i, \ldots E_j$ representing the degree to which actual projected output power varies from a target projected output power for the discrete portions $V_1, V_i, \ldots V_j$ of the image signal; and utilize the error signals $E_1, E_i, \ldots E_j$ to apply corrected control signals $G_1', G_i', \ldots G_j'$ to the gain section of the semiconductor laser for projection of compatible discrete portions $V_1', V_i', \ldots V_j'$ of the image signal, wherein the temporal or physical placement of the compatible discrete portions $V_1', V_i', \ldots V_j'$ of the image signal in the projected laser image is such that the image content of the compatible discrete portions $V_1', V_i', \ldots V_j'$ of the image signal is likely to mimic the image content of the discrete portions $V_1, V_i, \ldots V_j$ of the image signal.

* * * * *